(12) United States Patent
Bromberger

(10) Patent No.: US 7,358,181 B2
(45) Date of Patent: Apr. 15, 2008

(54) METHOD FOR STRUCTURING A SEMICONDUCTOR DEVICE

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 462 days.

(21) Appl. No.: 11/074,699

(22) Filed: Mar. 9, 2005

(65) Prior Publication Data

US 2005/0202669 A1    Sep. 15, 2005

(30) Foreign Application Priority Data

Mar. 10, 2004  (DE) .................... 10 2004 013 047

(51) Int. Cl.
*H01L 21/4763* (2006.01)
(52) U.S. Cl. ......... 438/637; 257/E21.23; 257/E21.203; 438/705; 438/661

(58) Field of Classification Search ........ 257/E21.203, 257/E21.209, E21.214, E21.23, E21.484, 257/E21.593; 438/705, 738, 627, 661, 655, 438/637
See application file for complete search history.

(56) References Cited

U.S. PATENT DOCUMENTS

| 4,818,723 | A | * | 4/1989 | Yen ........................... 438/647 |
| 5,587,338 | A | * | 12/1996 | Tseng ......................... 438/672 |
| 6,211,044 | B1 |  | 4/2001 | Xiang et al. ................. 438/585 |
| 2002/0187606 | A1 |  | 12/2002 | Drynan ....................... 438/253 |

* cited by examiner

*Primary Examiner*—Caridad Everhart
(74) *Attorney, Agent, or Firm*—Muncy, Geissler, Olds & Lowe PLLC

(57) ABSTRACT

A method for structuring a laterally extending first layer in a semiconductor device with the aid of a reactive second layer, which together with the first layer to be structured forms first reaction products, which products are removed by material removal that acts selectively on the first reaction products, whereby the structuring takes place in a vertical direction.

21 Claims, 2 Drawing Sheets

METHOD FOR STRUCTURING A SEMICONDUCTOR DEVICE

This nonprovisional application claims priority under 35 U.S.C. § 119(a) on German Patent Application No. DE102004013047.7 filed in Germany on Mar. 10, 2004, which is herein incorporated by reference.

BACKGROUND OF THE INVENTION

1. Field of the Invention

The present invention relates to a method for structuring a laterally extending first layer in a semiconductor device with the aid of a reactive second layer, which together with the first layer to be structured forms first reaction products, which are removed by material removal that acts selectively on the first reaction products.

2. Description of the Background Art

In this context, a semiconductor device is understood to mean a wafer, for example. A method is known from U.S. Pat. No. 6,211,044 B1 that is directed to the fabrication of MOS transistors having gate electrodes that are smaller than 0.1 micrometers in width. According to U.S. Pat. No. 6,211,044 B1, such widths cannot be defined reliably even with lithographic methods operating with ultraviolet light. In order to define such widths, first a nitride etch stop layer and then a first metallic reaction layer, and subsequently a layer that is inert relative to the reaction layer, are created on a wafer having a gate layer on a layer series of a dielectric gate layer and a semiconductor substrate.

A hard mask is formed from the reaction layer and the inert layer by lithographic steps, and this hard mask defines a lithography-dependent first width D1 in an etching step. After an etching step, corresponding mesa structures with the width D1 remain on the etch stop layer, which contain material of the first metallic reaction layer. To reduce the structure width, a second reaction layer of polysilicon is deposited, from which reactive spacers on the side walls of the mesa structures are created through an anisotropic etching step. The side walls of the mesa structures are silicidized by a laterally progressing reaction of the spacer material with the material of the first reaction layer, wherein a remaining volume of material of the first reaction layer with width D2<D1, between the silicidized side walls, is not encompassed by the reaction.

A structure width D2 that is reduced in the lateral direction is thus produced by selective etching of the silicide, in which the remaining volume is not removed. The remaining volume subsequently serves as a hard mask for structuring the etch stop layer and the gate layer beneath it.

In fabrication of semiconductor electronic devices and integrated circuits, it can be desirable to remove an existing layer, possibly as a function of location, to a defined depth.

One example is conductive layers of polysilicon that must be locally removed to a defined depth to permit dielectric insulation from conductive layers to be deposited thereon. For example, when a first conductor of polysilicon is deposited over a nitride block, a three-dimensional conductor structure results that is cut into during planarization.

A number of disadvantages arise in back-etching to the depth of the conductor in a dry etching chamber. For example, in the case of semiconductor devices, which have vertical poly conductor edges, long over-etching is necessary to remove the resulting spacers. In addition, undercut conductor edges must be freed from their spacers with the aid of isotropic etching chemistry, which impairs the selectivity of the etching with respect to adjacent dielectrics.

Wet back-etching of a polysilicon conductor does not provide adequate selectivity to oxide, and in the wet methods no endpoint is generally available for controlling the etching when etch stop layers are to be avoided.

SUMMARY OF THE INVENTION

It is therefore an object of the present invention to provide a method for local removal of a certain layer to a precisely defined depth that works without the use of a special etch stop layer and that avoids the disadvantages mentioned.

This object is attained in a method of the aforementioned type in that the structuring (accomplished through solid reactions between individual layers) takes place in a vertical direction.

These features result in the capability to convert a layer to be structured into a selectively soluble material with the aid of solid reactions in a vertical direction to a defined depth. Thereby, structured etching steps can be performed more precisely in a controllable manner without special etch stop layers.

In a preferred embodiment, a thickness of the second layer can control an extent of material removal taking place in the vertical direction.

The quantity of reaction products, and thus the depth to which the first layer to be structured is subsequently removed, is determined by the thickness of the second layer (auxiliary layer, reaction layer). Since the second layer can be deposited with high precision in its layer thickness, there results a corresponding precision with which the first layer can be structured in the vertical direction.

In a further embodiment, it is preferred for the first layer and the second layer to be locally separated from one another by third layer regions, wherein the third layer regions either do not react with the auxiliary layer, or in the event of reactions with the auxiliary layer form second reaction products that are not removed by the material removal that acts selectively on the first reaction products.

As a result of a structured intermediate layer as the third layer, the structuring reaction is suppressed locally, so the structuring of the first layer can be determined by the structure of the third layer.

Further, the first layer can be electrically conductive.

As a result of this embodiment, buried conductors can be produced that, by additional measures, can be dielectrically insulated vertically from additional vertically offset conductors.

Another preferred embodiment has the following steps:
production of the first layer on a substrate;
production of the third layer on the first layer;
local opening of the third layer such that the first layer is exposed at the opened locations;
production of the second layer on the third layer and on the opened locations where the first layer is exposed;
creation of conditions under which parts of the second layer react with parts of the first layer into the first reaction products; and
removal of the first reaction products.

A lateral structure is defined as a result of the exposure of the first layer through openings in the third layer. As a result of the production of the second layer, a reaction partner is provided for the first layer to be structured in the vertical direction. In the process, the third layer serves as a passivating intermediate layer, which permits reactions between the first and second layers only at the opened locations.

The first layer can also be produced by depositing semiconductor material over dielectric structures that are arranged on the substrate, and for the local opening of the third layer to be accomplished through a planarization step in which the dielectric structures serve as polish stop.

In the step of creating conditions under which parts of the third layer react with parts of the first layer into the first reaction products there can be a step in which the semiconductor device is temporarily subjected to elevated temperatures.

For the step of producing such reaction conditions there can be a step in which the semiconductor device is temporarily subjected to a nitrogen atmosphere.

It has become apparent that the desired solid reactions can be controlled with the aid of these conditions without undesirable reactions, such as the formation of oxides, occurring in the process. The nitride formed here under the nitrogen atmosphere with material of the reaction layer can generally be removed together with excess material of the reaction layer with the same etching agent.

In a further preferred embodiment, the dielectric structure is made of nitride.

The use of nitride as a dielectric structure has the special advantage that the nitride can be used as a polish stop in a later planarization step, which opens the passivating third layer. Moreover, the nitride structures can be selectively removed, providing further structuring possibilities in which the nitride structures, in later process steps, are, for example, wholly or partially replaced by spacers.

The first layer can be made of polysilicon, and the second layer can have at least one metal or a metal alloy, and the third layer can have $SiO_2$ and/or $Si_3N_4$.

The use of polysilicon makes it possible to produce buried conductors, for example. The aforementioned elements and alloys are suitable for use as reaction partners for polysilicon in order to produce silicides. Together with the aforementioned oxides and nitrides, material pairings result that can be selectively processed and structured.

The second layer can be made of titanium, so that the first reaction products are titanium silicide.

When titanium is used as the material of the second layer, the result is a temperature range for activation of the silicidation that is adequately broad, with an interval from 550° C. to 680° C., and is compatible with the requirements of silicon technology. In addition, any Ti nitride formed in addition to the desired Ti silicide can be removed together with excess titanium, for example, by a wet chemical etching step with a solution of $NH_4OH$, $H_2O_2$ and $H_2O$ in a ratio of 1 to 1 to 5.

Excess titanium can be removed by an etching step that preferentially removes the titanium and the titanium nitride formed under the nitrogen atmosphere.

The combined removal of the titanium and titanium nitride, as compared to sequential removal of the two substances, results in an economical process control without prolonging the process throughput time.

In another preferred embodiment, an etching agent of $H_2SO_4$ and $H_2O_2$ in a ratio of 2 to 1 or an etching agent of $NH_4OH$, $H_2O_2$ and $H_2O$ in a ratio of 1 to 1 to 5 can be used in the titanium-removing etching step.

These etching agents may be used as alternatives to one another. A titanium etching agent of $H_2SO_4$ and $H_2O_2$ in a ratio of 2 to 1 etches oxide at approximately one tenth the etching rate for titanium. In addition, it etches polysilicon and silicon nitride at approximately one thousandth the etching rate of titanium, and is thus excellently suited to selective removal of titanium and titanium nitride.

The titanium silicide can be removed by boiling, concentrated hydrochloric acid, or by $NH_3$ and $H_2O_2$ in a ratio of 1 to 1.

Hydrochloric acid and $NH_3$ and $H_2O_2$ in a ratio of 1 to 1 have an excellent selective action on oxide, nitride and polysilicon.

The volumes produced by the removal of the reaction products can be filled by a dielectric and a second conductive layer can be produced thereon.

As a result of this, easily controlled process sequences produce superimposed conductors that are separated by a dielectric intermediate layer, thus permitting simple manufacture of semiconductor devices with multiple conductive layers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
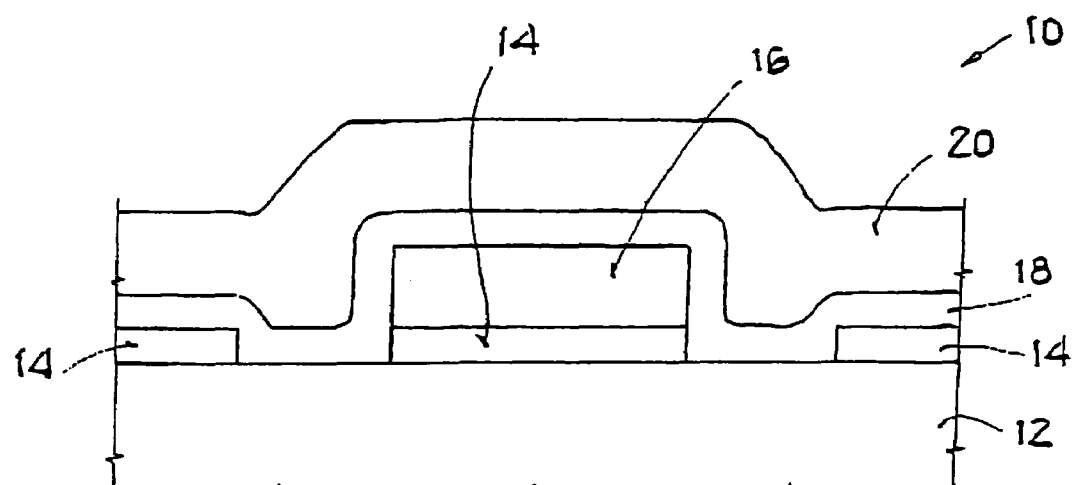
FIG. 1 is a cross-section of a wafer in a first manufacturing stage with a first layer and a passivating third layer according to an embodiment of the present invention.

In FIG. 1, number 10 designates a wafer having a substrate layer 12, which may already contain structures 14. The structures 14 may be, for example, dielectric layers that insulate electronic devices, which can be made later, such as transistors or capacitors, from the substrate layer 12 and that have a non-trivial topography. The substrate layer 12 can be silicon and can carry nitride blocks 16.

A laterally extending first layer 18 is produced over the nitride blocks. In a preferred embodiment, the first layer is electrically conductive, so that it can later be used as a conductor. The first layer 18 can be made of polysilicon, for example, and can be produced through chemical vapor deposition (CVD). Instead of polysilicon, it is also generally possible for a silicon layer of a morphology not specified in detail (monocrystalline or amorphous) to be deposited. Next, the first layer is covered by a passivating third layer 20, which can be formed for example of TEOS oxide. TEOS stands for tetraethyl orthosilicate. Decomposition of this compound at average temperatures (up to approximately 700° C.) produces silicon dioxide. During deposition of a TOES oxide, high-quality oxide films are produced, characterized by high breakdown field strength and conformal edge coverage, for example. Conformal edge coverage is important because of the step height of the nitride blocks. As an alternative to formation of a TEOS oxide layer, the surface of the first layer 18 can also be thermally oxidized so that a third layer 20 of silicon dioxide grows. As yet another alternative or in addition, the reaction-inhibiting, structured third layer 20 can also be made of $Si_3N_4$ and possibly also contain nonstoichiometric additions of oxygen ("SiON").

Figure 2:
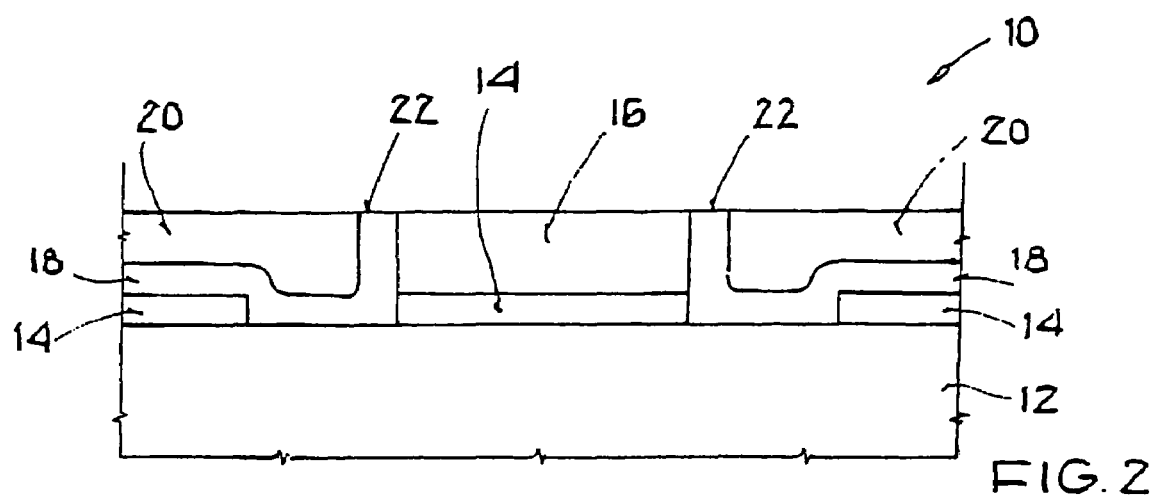
FIG. 2 shows the wafer from FIG. 1 after an opening planarization step.

FIG. 2 shows the wafer 10 after further process steps. Subsequent to formation of the passivating third layer 20, the third layer 20 is laterally structured, which is to say opened at individual locations. The structuring can be accomplished with the aid of lithographic masks or otherwise defined masks. As an alternative to a masking step, the opening can also be accomplished by a planarization step, in which the structure from FIG. 1 is abraded down to the nitride blocks 16, with the nitride blocks 16 serving as polish stop. FIG. 2 shows the wafer 10 after such a planarization step, in which the first layer 18 is cut into in the opened regions 22. During abrasion, layers located beneath the third layer 20 or parts of the substrate layer 12 can also be acted on or structured through, where this seems useful.

Figure 3:
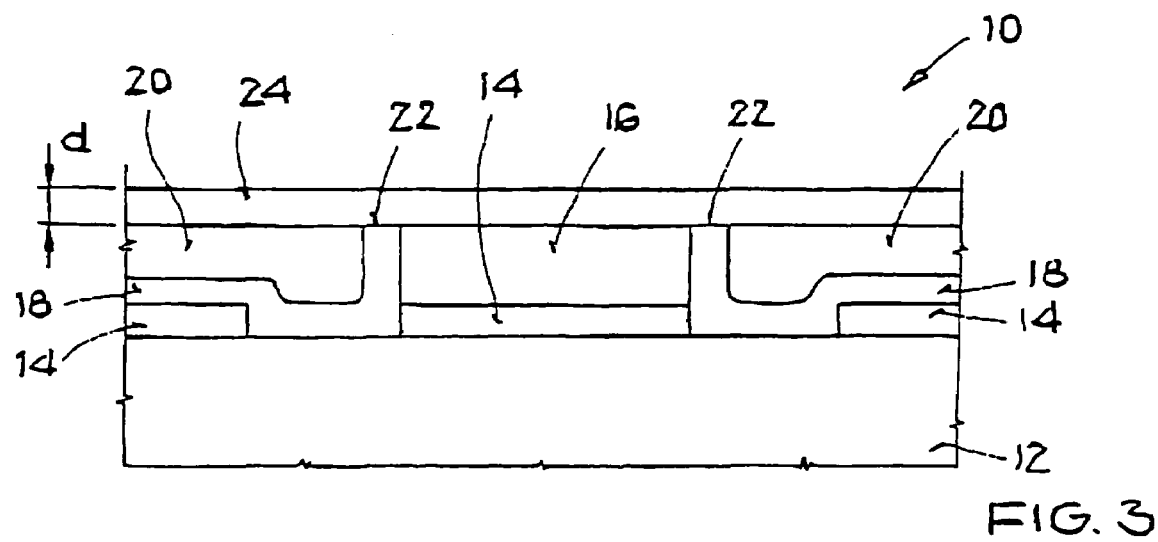
FIG. 3 shows the wafer from FIG. 2 after production of a second layer.

A reactive, second layer 24 is deposited on the opened structure in another step; under suitable conditions this layer, together with the first layer 18 to be structured, forms first reaction products that are removed by material removal which acts selectively on the first reaction products. FIG. 3 shows the wafer 10 after deposition of the second layer 24. In the embodiment with polysilicon as the material of the first layer, the upper, reactive second layer 24 can be, e.g., a transitional metal or a member of the lanthanide group, for example Pt, Ti, Co, Ni, Y or Gd, Dy, Er, Lu, Yb, or of mixtures of such transitional metals and/or lanthanides. Very generally speaking, the second layer 24 can be made of metals or metal alloys. In conjunction with polysilicon as the material of the first layer 18, titanium is considered an especially suitable material for the second layer 24. The thickness d of the second layer 24 determines the quantity of reactive material that lies over the opened regions 22. Consequently, the thickness of the layer 24 represents an important parameter for determining the depth of the solid reaction occurring in the vertical direction. Thus, as a consequence of the determination of the thickness of the third layer 24, it is possible to control and adjust the extent of subsequent material removal taking place in the vertical direction.

Outside of the opened regions 22, the first layer 18 and the second layer 24 are locally separated from one another by regions of the third layer 20. In these locations, the third layer 20 has a passivating, and hence a reaction-inhibiting, effect. As a result, structuring due to solid reactions between the first layer 18 and the second layer 24 only occurs in the opened regions 22 and largely only in the vertical direction.

Figure 4:
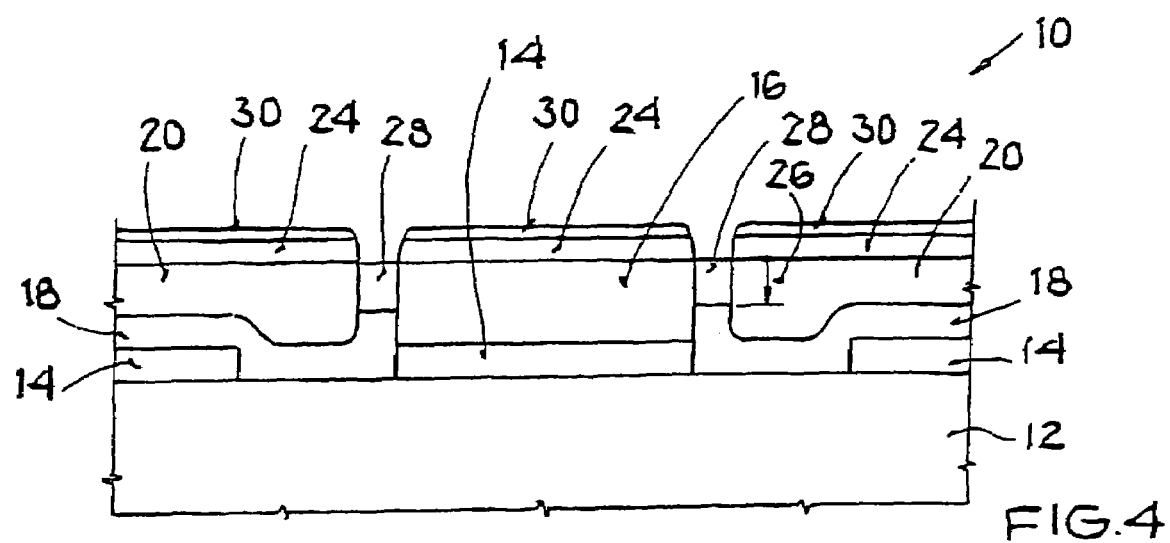
FIG. 4 shows the wafer from FIG. 3 after a creation of conditions under which parts of the second layer react with parts of the first layer into the first reaction products.

Subsequent to deposition of the third layer 24, a solid reaction is triggered by setting up suitable reaction conditions. Such conditions obtain for rapid thermal annealing (RTA) in a nitrogen atmosphere at 550° C. to 680° C. During this step, in addition to $TiSi_2$, TiN is formed in orthorhombic face-centered modification of the surface of the titanium layer. The temperature is limited at the lower end by the reaction rate of titanium with silicon, and at the upper end by the undesirable reaction of titanium with $SiO_2$ to form substoichiometric rutile (crystal of titanium and oxygen with fewer than two oxygen atoms per titanium atom). The $SiO_2$ stems from the reaction-inhibiting third layer 20, for example. The formation of substoichiometric rutile is undesirable because substoichiometric rutile does not possess the good insulating properties of $TiO_2$ and is difficult to remove by wet chemical processes. A substoichiometric rutile layer later remaining at the edge of the removed silicide after the $TiSi_2$ etching could lead to short circuits with conductors located above it. FIG. 4 shows the wafer after the conclusion of such a solid reaction, in which parts of the first layer 18 and of the second layer 24 have been converted into selectively soluble first reaction products 28 to a defined depth 26 in the first layer 18. In the case of polysilicon as the material of the first layer 18 and titanium as the material of the second layer 24, the first reaction products 28 is titanium silicide.

Next, there follows the removal, by, for example, a wet chemical etching step, of a TiN layer 30 formed during the RTA step and of the excess titanium from the second layer 24 that did not react with silicon from the first layer 18. This etching step can be accomplished, for example, through the use of an etching agent of $H_2SO_4$ and $H_2O_2$ in a ratio of 2 to 1 or an etching agent of $NH_4OH$, $H_2O_2$ and $H_2O$ in a ratio of 1 to 1 to 5.

Figure 5:
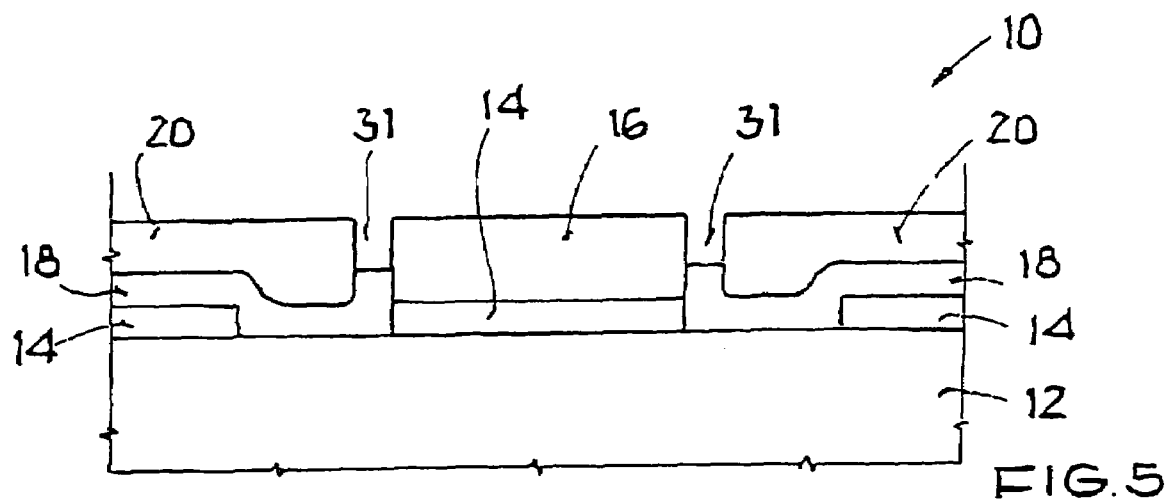
FIG. 5 shows the wafer from FIG. 4 after a removal of reaction products.

Then the reaction products 28, composed for example of titanium silicide, are removed. This can be accomplished by another wet chemical etching step by means of boiling in concentrated hydrochloric acid, for example. Alternatively, a titanium etching agent of $NH_3$: $H_2O_2$ can be used. Hydrochloric acid is excellently selective to oxide, nitride and polysilicon, while the cited titanium etching agent etches oxide at approximately one tenth the etching rate for titanium, and polysilicon and silicon nitride at approximately one thousandth. FIG. 5 shows the wafer 10 after the process steps of producing the first layer 18 on a substrate 12, producing the third layer 20 on the first layer 18, local opening of the third layer 20 such that the first layer 18 is exposed at the opened locations (22 in FIGS. 2 and 3), production of the second layer 24 on the third layer 20, creation of conditions under which parts of the second layer 24 react with parts of the first layer 18 into the first reaction products 28, and removal of the first reaction products 28. Material-free volumes 31 are created as a result of the removal of the reaction products 28.

In another process step, the volumes 31 that result from removal of the reaction products 28 can be filled with a dielectric. In a preferred sequence of further process steps, however, after removal of the third layer 20 and conversion of the remaining parts of the first layer 18 into silicide 32, another dielectric is first applied, and planarized by CMP while using the nitride block 16 as polish stop. Then the nitride block 16 and parts of the structures 14 are removed. Inside spacers 34 are placed in the resultant opening.

Figure 6:
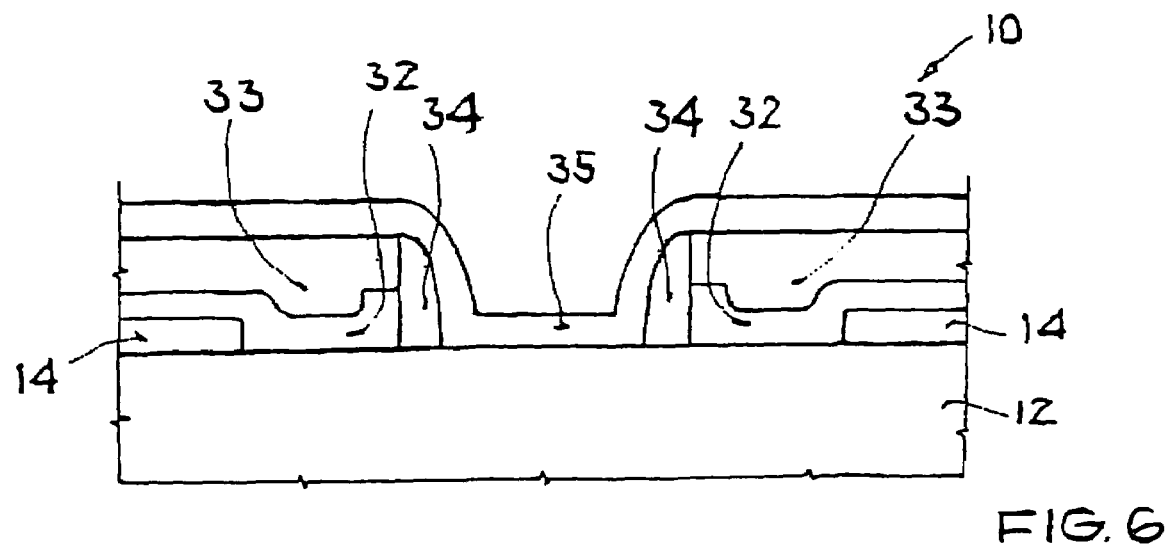
FIG. 6 shows a wafer from FIG. 5 after additional process steps according to a further embodiment of the present invention.

FIG. 6 shows the structure produced after application of another electrically conductive layer 35, in which electrically conductive structures 32, 35 that are self-aligned with one another but electrically insulated from one another, have been produced through the use of solid reactions progressing in the vertical direction.

In sum, in the method introduced here for back-etching, an auxiliary layer 24 is deposited that is reactive with the first layer 18 at a subsequent high temperature step, but not with the dielectric 20 employed, and is caused to react with the first layer 18. The feed materials are chosen such that both the layer 24 and its reaction products 28 with the first layer 18 can be selectively removed. The thickness of the layer 24, precisely controlled during the deposition, determines the depth of the solid reaction so no etch stop layer is necessary. In the ideal case, the part of the layer 24 that is not converted by the solid reaction, which is to say the part above the dielectric 20, can also be removed selectively with respect to the other layers.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for structuring a laterally extending first layer in a semiconductor device with the aid of a reactive second layer, which together with the first layer forms first reaction products, which are removed by material removal that acts selectively on the first reaction products, the first layer and the second layer at least partially separated by one or more third layer regions, wherein the structuring takes place in a vertical direction, the vertical direction being substantially perpendicular to a plane in which the first layer laterally extends.

2. The method according to claim 1, wherein an extent of material removal taking place in the vertical direction is controlled by a thickness of the second layer.

3. The method according to claim 1, wherein the first layer and the second layer are substantially separated by the third layer regions, wherein the third layer regions either do not react with the second layer, or in the event of reactions with the second layer form second reaction products that are not removed by the material removal that acts selectively on the first reaction products.

4. The method according to claim 1, wherein the first layer is electrically conductive.

5. The method according to claim 1, wherein the one or more third layer regions is resistant to the material removal that acts selectively on the first reaction products.

6. The method according to claim 1, further comprising the steps of:
producing the first layer on a substrate;
producing a third layer on the first layer, the third layer including among the one or more third layer regions;
local opening of the third layer such that the first layer is exposed at opened locations;
producing the second layer on the third layer;
reacting a portion of the second layer with a portion of the first layer thereby forming first reaction products; and
removing the first reaction products.

7. The method according to claim 6, wherein the step of reacting the portion of the second layer with the portion of the first layer into the first reaction products further includes a step in which the semiconductor device is temporarily subjected to a nitrogen atmosphere.

8. The method according claim 6, wherein volumes that are produced by the removal of the first reaction products are filled by a dielectric, and a second conductive layer is produced thereon.

9. The method according to claim 6, wherein the first layer is produced by depositing a semiconductor material over a dielectric structure that is arranged on the substrate, and wherein the local opening step of the layer is performed by a planarization step in which the dielectric structure functions as polish stop.

10. The method according to claim 9, wherein the step of reacting the portion of the second layer with the portion of the first layer into the first reaction products further includes a step in which the semiconductor device is temporarily subjected to elevated temperatures.

11. The method according to claim 9, wherein the dielectric structure is a nitride.

12. The method according to claim 6, wherein the first layer is polysilicon; the second layer has at least one metal or at least one metal alloy; and the third layer has $SiO_2$ and/or $Si_3N_4$.

13. The method according to claim 12, wherein the second layer is titanium, so that the first reaction products are titanium silicide.

14. The method according to claim 13, wherein excess titanium is removed by an etching step that removes the titanium and the titanium nitride formed under a nitrogen atmosphere.

15. The method according to claim 14, wherein an etching agent of $H_2SO_4$ and $H_2O_2$ in a ratio of 2 to 1 or an etching agent of $NH_4OH$, $H_2O_2$ and $H_2O$ in a ratio of 1 to 1 to 5 is used in the titanium-removing etching step.

16. The method according to claim 13, wherein the titanium silicide is removed by boiling concentrated hydrochloric acid or by $NH_3$ and $H_2O_2$ in a ratio of 1 to 1.

17. A method of manufacturing a semiconductor device, the method comprising the steps of:
providing a substrate;
depositing a first layer on a surface of the substrate;
forming a second layer on the first layer;
removing a portion of the second layer such that a portion of the first layer is exposed;
depositing a third layer onto the second layer and the exposed portion of the first layer;
converting the portion of the exposed first layer and a portion of the third layer into a first reaction product to a predetermined depth within first layer; and
removing the first reaction product to thereby form apertures that extend from a surface of the second layer to the first layer.

18. The method according to claim 17, wherein the predetermined depth is determined by a thickness of the third layer.

19. The method according to claim 17, wherein the apertures extend to the first layer in a direction that is substantially perpendicular to the surface of the substrate.

20. The method according to claim 17, wherein the portion of the exposed first layer and a portion of the third layer is converted into a first reaction product by a solid reaction process.

21. The method to according to claim 17, wherein the first reaction product is removed by a chemical etching process.

* * * * *